United States Patent
Cho et al.

(10) Patent No.: US 9,825,253 B2
(45) Date of Patent: Nov. 21, 2017

(54) ORGANIC LIGHT-EMITTING DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Sung-Ho Cho, Yongin (KR); Hyun-Young Kim, Yongin (KR); Il-Ryong Cho, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 104 days.

(21) Appl. No.: 14/312,439

(22) Filed: Jun. 23, 2014

(65) Prior Publication Data

US 2015/0001501 A1 Jan. 1, 2015

(30) Foreign Application Priority Data

Jun. 28, 2013 (KR) .................. 10-2013-0075937
Jun. 16, 2014 (KR) .................. 10-2014-0072691

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3244* (2013.01); *H01L 27/3276* (2013.01); *H01L 51/5246* (2013.01); *H01L 51/56* (2013.01)

(58) Field of Classification Search
CPC . H01L 51/5253; H01L 51/56; H01L 51/5246; H01L 51/5243; H01L 151/525; H01L 27/3276; H01L 27/3244
See application file for complete search history.

(56) References Cited

U.S. PATENT DOCUMENTS

| 7,538,488 B2 * | 5/2009 | Kwak ............... H01L 51/5237 313/506 |
| 8,067,883 B2 | 11/2011 | Wang |
| 2005/0184927 A1 | 8/2005 | Kwak |
| 2007/0195252 A1 | 8/2007 | Tsai et al. |
| 2007/0291216 A1 * | 12/2007 | Chan ............... G02F 1/1339 349/153 |
| 2012/0146041 A1 | 6/2012 | Han et al. |

FOREIGN PATENT DOCUMENTS

| EP | 2 164 105 A2 | 3/2010 |
| KR | 10-2007-0107221 A | 11/2007 |

OTHER PUBLICATIONS

EPO Search Report dated Feb. 20, 2015, corresponding to European Patent application 14174847.5, (9 pages).

* cited by examiner

*Primary Examiner* — Lauren R Bell
(74) *Attorney, Agent, or Firm* — Lewis Roca Rothgerber Christie LLP

(57) ABSTRACT

An organic light-emitting apparatus includes a lower substrate comprising a display area and a peripheral area around the display area; a first insulating layer on the display area and the peripheral area of the lower substrate, wherein a plurality of penetration holes are formed in the first insulating layer in the peripheral area; an upper substrate on the lower substrate; and a sealant in the plurality of penetration holes bonding the lower substrate to the upper substrate.

17 Claims, 9 Drawing Sheets

ORGANIC LIGHT-EMITTING DISPLAY APPARATUS AND METHOD OF MANUFACTURING THE SAME

CROSS-REFERENCE TO RELATED APPLICATION

This application claims priority to and the benefit of Korean Patent Application Nos. 10-2013-0075937 and 10-2014-0072691, filed on Jun. 28, 2013 and Jun. 16, 2014, in the Korean Intellectual Property Office, the disclosures of which are incorporated herein in their entirety by reference.

BACKGROUND

1. Field

One or more embodiments of the present invention relate to an organic light-emitting display apparatus and a method of manufacturing the same.

2. Description of the Related Art

In general, an organic light-emitting display apparatus is manufactured by forming organic light-emitting diodes (OLEDs) on a lower substrate, and bonding the lower substrate and an upper substrate such that the OLEDs are positioned between the lower and upper substrates. The organic light-emitting display apparatus may be used as a display unit in small devices such as cellular phones, and in large devices such as televisions.

In the organic light-emitting display apparatus, a sealant is used to bond the lower and upper substrates. A region in which the sealant is disposed is regarded as a dead space, which is a non-display region.

SUMMARY

One or more embodiments of the present invention include an organic light-emitting display apparatus in which shock damage may be reduced and a method of manufacturing the same.

Additional aspects will be set forth in part in the description which follows and, in part, will be apparent from the description, or may be learned by practice of the presented embodiments.

According to one or more embodiments of the present invention, an organic light-emitting display apparatus includes a lower substrate comprising a display area and a peripheral area around the display area; a first insulating layer on the display area and the peripheral area of the lower substrate, wherein a plurality of penetration holes are formed in the first insulating layer in the peripheral area; an upper substrate on the lower substrate; and a sealant in the plurality of penetration holes bonding the lower substrate to the upper substrate.

The organic light-emitting display apparatus may further include a second insulating layer between the upper substrate and the first insulating layer.

The organic light-emitting display apparatus may further include a conductive layer between the lower substrate and the first insulating layer, wherein a plurality of penetration openings are formed in the conductive layer.

The first insulating layer may include a plurality of penetration hole sets that correspond to the plurality of penetration openings in the conductive layer, and each of the plurality of penetration hole sets may include two or more of the penetration holes.

An area of each of the plurality of penetration hole sets in the first insulating layer may be narrower than an area of each of the plurality of penetration openings in the conductive layer.

An inner surface of each of the plurality of penetration openings in the conductive layer may be covered by the first insulating layer, and may not contact the sealant.

A distance between the two or more of the penetration holes in each of the plurality of penetration hole sets in the first insulating layer may be 2.5 μm or more.

An inner surface of each of the plurality of penetration openings in the conductive layer may be covered by the first insulating layer, and may not contact the sealant.

A distance between the plurality of penetration openings in the conductive layer may be 20.5 μm or more.

The display area may include a thin film transistor including a gate electrode, and the conductive layer may include a same material as that of the gate electrode in the thin film transistor.

The conductive layer and the gate electrode may be disposed on a same layer.

In a surface parallel to the lower substrate, a total area of the plurality of penetration holes in the first insulating layer may be in a range of 9.8% and 16.5% of an area of the sealant.

The display area may include a buffer layer, a gate insulating film, an interlayer insulating film, and a protective film, and the first insulating layer may be an extended portion of at least one of the buffer layer, the gate insulating film, the interlayer insulating film, and the protective film.

The organic light-emitting display apparatus may further comprise a conductive layer interposed between the lower substrate and the first insulating layer or located in the first insulating layer, wherein the conductive layer locates in the peripheral area, has a plurality of penetration openings, and has a width-change part in which a width of the conductive layer changes.

The first insulating layer may have a first portion and a second portion, the first portion contacting a layer beneath the conductive layer through the plurality of penetration openings of the conductive layer, the second portion contacting the layer beneath the conductive layer outside the conductive layer in a region of the width-change part of the conductive layer.

The organic light-emitting display apparatus may further comprise a conductive layer interposed between the lower substrate and the first insulating layer or located in the first insulating layer, wherein the conductive layer locates in the peripheral area and locates biasedly to the display area.

The number of the plurality of penetration holes of the first insulating layer per unit area in a region where the first insulating layer does not correspond to the conductive layer may be higher than the number of the plurality of penetration holes of the first insulating layer per unit area in a region where the first insulating layer corresponds to the conductive layer.

The organic light-emitting display apparatus may further comprises a dummy semiconductor layer on or under the first insulating layer or in the first insulating layer, wherein the dummy semiconductor layer locates in the peripheral area, and has a plurality of penetration apertures corresponding to the plurality of penetration holes of the first insulating layer, and wherein the sealant fills the plurality of penetration apertures and the plurality of penetration holes.

The display area may comprise a thin film transistor comprising a semiconductor layer, and the dummy semiconductor layer may comprise a same material as that of the semiconductor layer in the thin film transistor.

The dummy semiconductor layer and the semiconductor layer may be disposed on a same layer.

According to another embodiment of the present invention, a method of manufacturing an organic light-emitting display apparatus includes: preparing a lower substrate comprising a display area and a peripheral area around the display area; forming an insulating layer over the display area and the peripheral area of the lower substrate; forming a plurality of penetration holes in the peripheral area; arranging an upper substrate to corresponds to the lower substrate; and bonding the lower substrate and the upper substrate by using a sealant, the sealant filling the plurality of penetration holes in the insulating layer.

The method may further include forming a conductive layer in the peripheral area of the lower substrate, the conductive layer comprising a plurality of penetration openings, and wherein forming the insulating layer comprises forming the insulating layer so that the conductive layer is between the lower substrate and the insulating layer or is in the insulating layer.

The method may further include forming a plurality of penetration hole sets in the insulating layer that correspond to the plurality of penetration openings in the conductive layer, wherein each of the plurality of penetration hole sets comprise two or more of the penetration holes.

A distance between the two or more of the penetration holes in each of the plurality of penetration hole sets in the insulating layer may be 2.5 μm or more.

A distance between the plurality of penetration openings may be 20.5 μm or more.

A total area of the plurality of penetration holes in the insulating layer may be in a range of 9.8% and 16.5% of an area of the sealant.

Forming the insulating layer may include forming a buffer layer, a gate insulating film, an interlayer insulating film, and a protective film over the display area and the peripheral area of the lower substrate, and forming the plurality of penetration holes through the buffer layer, the gate insulating film, the interlayer insulating film, and the protective film.

BRIEF DESCRIPTION OF THE DRAWINGS

Aspects of the present invention will become more apparent and more readily appreciated from the following description of the embodiments, taken in conjunction with the accompanying drawings of which.

DETAILED DESCRIPTION

Figure 1:
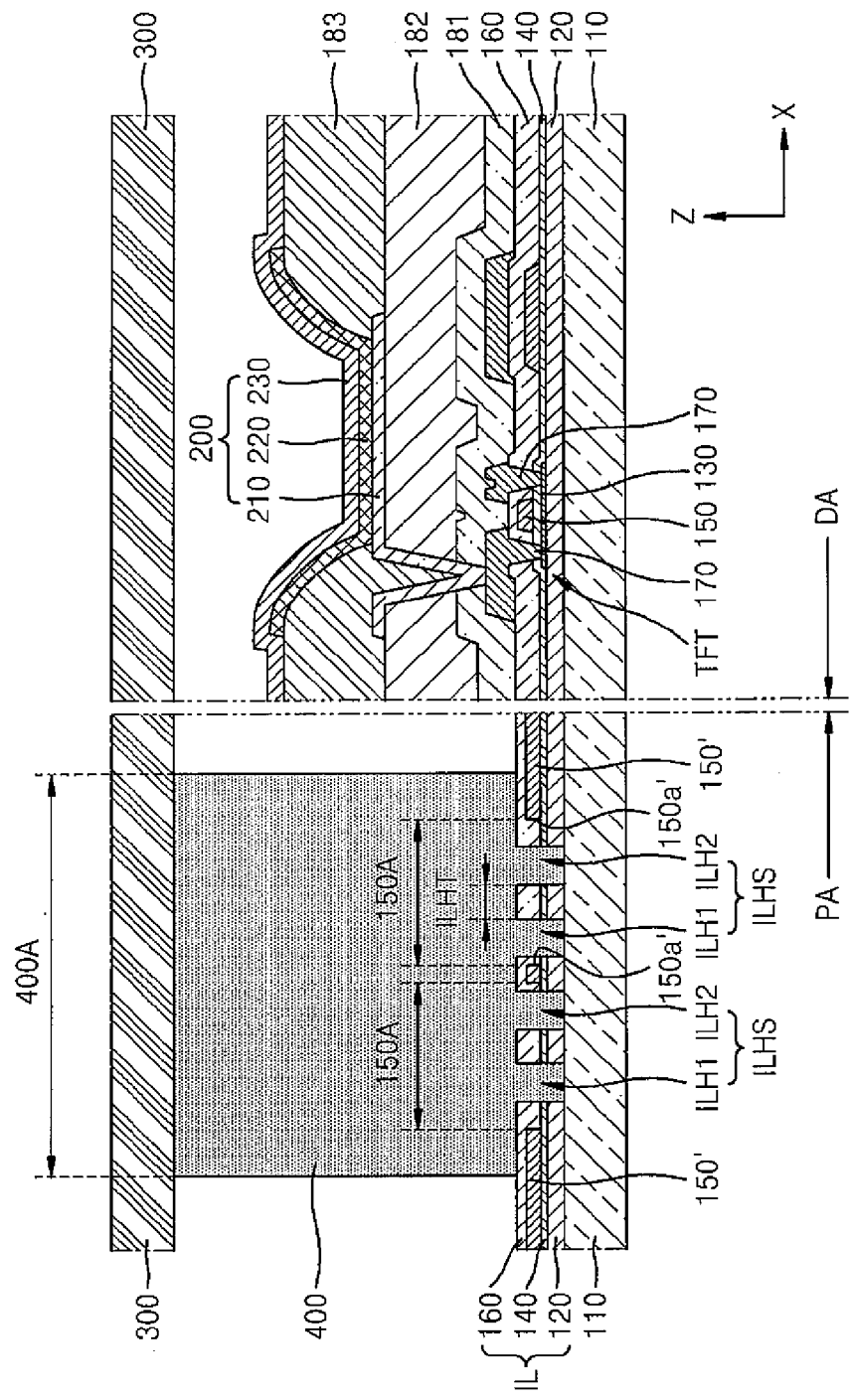
FIG. 1 is a cross-sectional view illustrating a portion of an organic light-emitting display apparatus, according to an embodiment of the present invention.

Reference will now be made in some detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present invention. Also, the thickness or size of each layer illustrated in the drawings is exaggerated for convenience of explanation and clarity.

In the following description, an x-axis, a y-axis, and a z-axis are not limited to three axes on a rectangular coordinate system and may be interpreted in a broader sense. For example, the x-axis, y-axis, and z-axis may be perpendicular to one another or may indicate different directions that are not perpendicular to one another.

Also, in the following description, when a constituent element such as a layer, a film, a region, or a plate is described to exist on another constituent element, the constituent element may exist directly on the other constituent element or another constituent element may be disposed therebetween.

As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view illustrating a portion of an organic light-emitting display apparatus, according to an embodiment of the present invention.

Referring to FIG. 1, the organic light-emitting display apparatus according to an embodiment of the present invention includes a lower substrate 110, an upper substrate 300, an insulating layer 1L, and a sealant 400.

The lower substrate 110 includes a display area DA and a peripheral area PA that surrounds the display area DA. The lower substrate 110 may be formed by using various materials such as glass, metal, or plastic. A plurality of thin film transistors TFT are positioned in the display area DA of the lower substrate 110. Also, a plurality of organic light-emitting diodes (OLEDs) 200 that are electrically coupled to the plurality of thin film transistors TFT may be positioned in the display area DA. When the OLEDs 200 are electrically coupled to the plurality of the thin film transistors TFT, such a connection may be regarded as a plurality of pixel electrodes 210 being electrically coupled to the plurality of thin film transistors TFT.

Each thin film transistor TFT includes a semiconductor layer 130 that includes amorphous silicon or poly silicon, or an organic semiconductor; a gate electrode 150; and source/ drain electrodes 170. On the lower substrate 110, a buffer layer 120 formed of silicon oxide or silicon nitride is positioned, so as to planarize a surface of the lower substrate 110 or to prevent impurities from penetrating into the semiconductor layer 130. The semiconductor layer 130 may be positioned on the buffer layer 120.

The gate electrode 150 is positioned on the semiconductor layer 130. The source/drain electrodes 170 electrically communicate with each other according to a signal that is applied to the gate electrode 150. Depending on an adhesion strength between adjacent layers, a degree of surface planarization of stacked layers, and processability, the gate electrode 150 may be formed to have a single or multi-layer structure by using at least one of materials such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). A gate insulating film 140, which is formed by using a material such as silicon oxide and/or silicon nitride, may be formed between the semiconductor 130 and the gate electrode 150 to insulate the semiconductor layer 130 from the gate electrode 150.

An interlayer insulating film 160 may be positioned on the gate electrode 150, and may be formed to have a single or multi-layer structure by using materials such as silicon oxide or silicon nitride.

The source/drain electrodes 170 are positioned on the interlayer insulating film 160. The source/drain electrodes 170 are electrically coupled to the semiconductor layer 130 respectively through contact holes, which are formed in the interlayer insulating film 160 and the gate insulating film 140. In consideration of conductivity, the source/drain electrodes 170 may be formed to have a single or multi-layer structure by using at least one of materials such as Al, Pt, Pd, Ag, Mg, Au, Ni, Nd, Ir, Cr, Li, Ca, Mo, Ti, W, and Cu.

A first insulating film 181, which is a protective film covering the thin film transistor TFT to protect the thin film transistor TFT having a structure as described above, may be provided. The first insulating film 181 may be formed of inorganic materials such as silicon oxide, silicon nitride, or silicon oxynitride. Although the first insulating film 181 is illustrated as a single layer in FIG. 1, the first insulating film 181 may be modified to have a multi-layer structure or may be modified in other various ways.

A second insulating film 182 may be positioned on the first insulating film 181. For example, when the OLED 200 is positioned on the thin film transistor TFT as shown in FIG. 1, the second insulating film 182, which operates as a planarization film for planarizing an upper surface of the first insulating film 181 that covers the thin film transistor TFT, may be provided. The second insulating film 182 may be formed of materials such as an acryl-based organic material or benzocyclobutene (BCB). Although the second insulating film 182 is illustrated as a single layer in FIG. 1, the second insulating film 182 may be modified to have a multi-layer structure or may be modified in other various ways.

In the display area DA of the lower substrate 110, the OLED 200, which includes the pixel electrode 210, an opposite electrode 230, and an intermediate layer 220 positioned between the pixel electrode 210 and the opposite electrode 230, is positioned on the second insulating film 182.

An opening, which exposes at least one of the source/drain electrodes 170, is provided in the first and second insulating films 181 and 182. The pixel electrode 210, which contacts either one of the source/drain electrodes 170 through the opening and thus is electrically coupled to the thin film transistor TFT, is positioned on the second insulating film 182. The pixel electrode 210 may be a (semi) transparent electrode or a reflective electrode. When the pixel electrode 210 is a (semi) transparent electrode, the pixel electrode 210 may be formed of materials such as indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 210 is a reflective electrode, the pixel electrode 210 may include a reflective film formed of Ag, Mg, Al, Pt, Pd, Au, Ni, Nd, Ir, Cr, or a compound thereof, and a layer formed of ITO, IZO, ZnO, $In_2O_3$, or AZO. A structure and a material of the pixel electrode 210 are not limited thereto, and may be modified in various ways. For example, the pixel electrode 210 may be formed to have a single or multi-layer structure.

A third insulating film 183 may be positioned on the second insulating film 182. The third insulating film 183 is a pixel defining film, which defines a pixel by having an opening corresponding to each sub-pixel, that is, an opening through which at least a central portion of the pixel electrode 210 is exposed. In addition, the third insulating film 183 may prevent an arc or the like from occurring at an end portion of the pixel electrode 210 by increasing a distance between the end portion of the pixel electrode 210 and the opposite electrode 230 that is positioned on the pixel electrode 210. The third insulating film 183 may be formed of an organic material such as polyimide.

The intermediate layer 220 may include a low molecular weight material or a high molecular weight material. When the intermediate layer 220 includes a low molecular weight material, a hole injection layer (HIL), a hole transport layer (HTL), an emission layer (EML), an electron transport layer (ETL), or an electron injection layer (EIL) may be stacked to form a single or multiple layer structure. Also, various organic materials such as copper phthalocyanine (CuPc), N,N'-Di(naphthalene-1-yl)-N,N'-diphenyl-benzidine (NPB), or tris-8-hydroxyquinoline aluminum (Alq3) may be used to form the intermediate layer 220. The intermediate layer 220 may be formed by any suitable method such as using a vacuum deposition method.

When the intermediate layer 220 includes a high molecular weight material, the intermediate layer 220 may include the HTL and EML. In this case, the HTL may be formed of poly(3,4-ethylenedioxythiophene) (PEDOT), and the EML may be formed of a high molecular weight material such as poly-phenylenevinylene (PPV) or polyfluorene. The intermediate layer 220 may be formed by using a method such as a screen printing method, an inkjet printing method, or a laser induced thermal imaging (LITI) method.

The intermediate layer 220 is not limited to the structure described above, and may be modified in various ways.

The opposite electrode 230 is positioned on the display area DA to cover the display area DA as shown in FIG. 1. That is, the opposite electrode 230 may be integrally formed through a plurality of OLEDs 200 and correspond to the plurality of pixel electrodes 210. The opposite electrode 230 may be a (semi) transparent electrode or a reflective electrode. When the opposite electrode 230 is a (semi) transparent electrode, the opposite electrode 230 may include a layer formed of a conductive material or metal having a low work function, that is, Li, Ca, LiF/Ca, LiF/Al, Al, Ag, Mg, or a compound thereof, and a (semi) transparent conductive layer formed of ITO, IZO, ZnO, or $In_2O_3$. A structure and a material of the opposite electrode 230 are not limited thereto, and may be modified in various ways.

The upper substrate 300 corresponds to the lower substrate 110, and may be formed of various materials such as glass, metal, or plastic. The lower and upper substrates 300 and 110 may be bonded to each other by using the sealant 400.

The buffer layer 120, the gate insulating film 140, and the interlayer insulating film 160 may be referred collectively as the insulating layer IL. The insulating layer IL may be formed over the display area DA and the peripheral area PA of the lower substrate 110 as shown in FIG. 1. The insulating layer IL includes a plurality of penetration holes ILH1 and ILH2 in the peripheral area PA. The sealant 400 fills the plurality of penetration holes ILH1 and ILH2 of the insulating layer IL, and bonds the lower substrate 110 and the upper substrate 300. The sealant 400 may include frit or epoxy, but is not limited thereto.

The insulating layer IL recited in the claims may not be construed as a stack structure including the buffer layer 120, the gate insulating film 140, and the interlayer insulating film 160. For example, the insulating layer IL recited in the claims may be construed as a stack structure including only the interlayer insulating film 160. In this case, the buffer layer 120 and gate insulating film 140 may not include the plurality of penetration holes ILH1 and ILH2.

For some cases, the insulating layer IL recited in the claims may include the gate insulating film 140 and the interlayer insulating film 160, thus the gate insulating film 140 and the interlayer insulating film 160 may include the plurality of penetration holes ILH1 and ILH2, and the buffer layer 120 may not be patterned. In these cases, the buffer layer 120 may be regarded as an additional insulating layer recited in the claim that is interposed between the lower substrate 110 and the insulating layer IL.

To use the sealant 400 and relatively securely bond the lower and upper substrates 110 and 300 to each other, a sufficient contact area is to be provided. However, the greater an area of the sealant 400 (which may be regarded as a width 400A of the sealant 400 in FIG. 1), the greater the dead space, that is, an area of the peripheral area PA, outside of the display area DA. Therefore, the area of the sealant 400 is to be decreased so as to reduce the dead space. In the organic light-emitting display apparatus according to an embodiment of the present invention, the insulating layer IL includes the plurality of penetration holes ILH1 and ILH2. Accordingly, while an area of the sealant 400 on a surface parallel to the lower substrate 110 (an XY surface) is reduced, an area of the sealant 400 that contacts elements on the lower substrate 110, that is, the insulating layer IL, may be maintained or expanded. Thus, by reducing the area of the sealant 400, the dead space may be reduced while an adhesion strength of the sealant 400 that bonds the lower and upper substrates 110 and 300 to each other may be maintained or improved.

Figure 2:
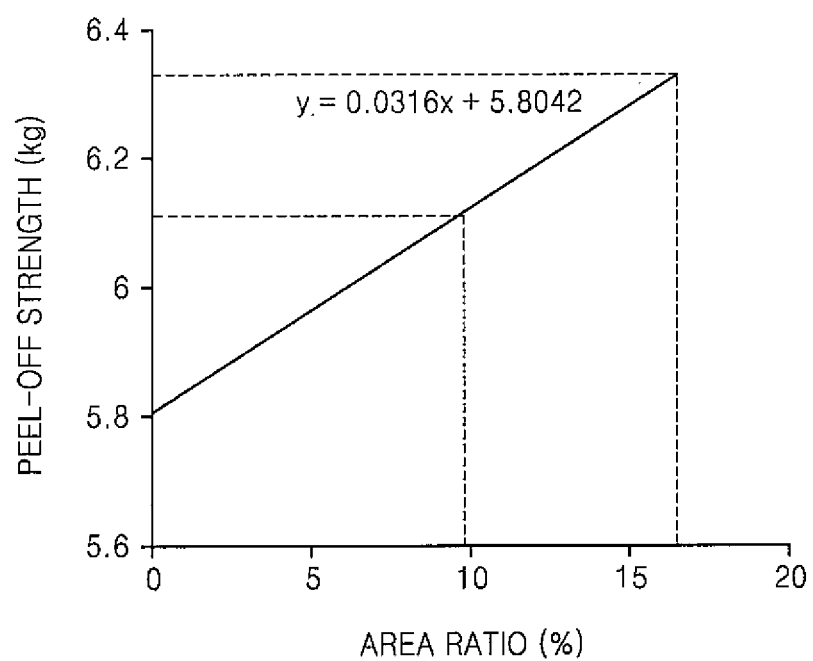
FIG. 2 is a graph illustrating a peel-off strength of a sealant according to an area of a plurality of penetration holes in an insulating layer of the organic light-emitting display apparatus of FIG. 1.

FIG. 2 is a graph illustrating a peel-off strength (e.g., an adhesion strength) of the sealant 400 based on an area of the plurality of penetration holes ILH1 and ILH2 in the insulating layer IL of the organic light-emitting display apparatus of FIG. 1. In the surface parallel to the lower substrate 110 (the XY surface), a ratio of the area of the sealant 400 to the total area of the plurality of penetration holes ILH1 and ILH2 in the insulating layer IL is shown on an x-axis; and the peel-off strength, which is a force that separates the lower substrate 110 from the sealant 400, is shown on a y-axis. A relationship between the ratio of the area of the sealant 400 to the total area of the plurality of penetration holes ILH1 and ILH2 and the peel-off strength may be represented as y=0.0316x+5.8042, which is determined by carrying out an experiment multiple times. A unit of the peel-off strength is a weight (kg) applied on 19 mm width X 19 mm height area; a unit of the ratio is a percentage (%).

In mobile devices that include an organic light-emitting display apparatus as a display unit, a maximum peel-off strength that the organic light-emitting display apparatus may be able to endure in a general usage environment may be, for example, 6.11 kg. The maximum peel-off strength may be regarded as a maximum impact force that may be applied to the organic light-emitting display apparatus when the organic light-emitting display apparatus makes an impact with a surface (e.g., by falling or being dropped on a surface or the ground). In order to prevent the sealant 400 from being faulty under such conditions, the ratio of the area of the sealant 400 to the area of the plurality of penetration holes ILH1 and ILH2 in the insulating layer IL is to be about 9.8% or more, as shown using a dotted line in FIG. 2.

Referring back to FIG. 1, the organic light-emitting display apparatus may include a metal layer 150' (conductive layer) which is formed between the lower substrate 110 and the insulating layer IL in the peripheral area PA and includes a plurality of penetration openings 150A. The metal layer 150' may be extended into the display area DA. As described above, because the display area DA includes the thin film transistor TFT including the gate electrode 150, the metal layer 150' may include the same material as that of the gate electrode 150. Specifically, the metal layer 150' and the gate electrode 150 may be formed on the same layer. In FIG. 1, the metal layer 150' is illustrated as being formed on the gate insulating film 140, like the gate electrode 150. In some embodiments, the metal layer 150' may include the same material and be formed on the same layer as that of the source/drain electrode 170 of the thin film transistor TFT. For convenience of description, an embodiment in which the metal layer 150' includes the same material and is formed on the same layer as that of the gate electrode 150 will be described hereinafter.

When bonding the lower and upper substrates 110 and 300 by using the sealant 400, ultraviolet (UV) light or a laser beam may irradiate the sealant 400 to cure the sealant 400. Specifically, the UV light or laser beam may penetrate through the upper substrate 300 and irradiate the sealant 400. Then, the UV light or laser beam that has reached the sealant 400 may be reflected off the metal layer 150' under the sealant 400, and be redirected toward the sealant 400. Therefore, the UV light or laser beam may irradiate the sealant 400 more efficiently.

An area of the sealant 400 contacting the upper substrate 300 may be relatively easily observed through the upper substrate 300 formed of a transparent material. However, the area of the sealant 400 contacting the lower substrate 110 may not be observed through the opaque metal layer 150'. Therefore, by including the plurality of penetration openings 150A in the sealant 400, depending on whether or not the sealant 400 may be observed through the plurality of penetration openings 150A in the metal layer 150', the area of the sealant 400 contacting the lower substrate 110 may be identified. Accordingly, a faulty sealing may be easily identified by identifying whether or not the area of the sealant 400 contacting the upper substrate 300 and/or lower substrate 110 are/is the same as or greater than a minimum value of an area (e.g., a predetermined area).

An inner surface 150a' of each of the plurality of penetration openings 150A in the metal layer 150' may be covered by using the insulating layer IL so as to not contact the sealant 400. In FIG. 1, the metal layer 150' is covered by using the interlayer insulating film 160, and accordingly, the inner surface 150a' of each of the plurality of penetration openings 150A in the metal layer 150' does not contact the sealant 400.

The plurality of penetration holes ILH1 and ILH2 in the insulating layer IL may be formed by concurrently (e.g., simultaneously) etching the buffer layer 120, gate insulating film 140, and interlayer insulating film 160. During this process, when the inner surface 150a' of each of the plurality of penetration openings 150A in the metal layer 150' is exposed through the plurality of penetration holes ILH1 and ILH2, the metal layer 150' in which the plurality of penetration openings 150A are already formed may be additionally etched. Thus, problems such as enlargement of an area of the plurality of penetration openings 150A in the metal layer 150' may occur. To prevent or reduce such a problem from occurring, the inner surface 150a' of each of the plurality of penetration openings 150A in the metal layer 150' may be covered by using the insulating layer IL so as to not contact the sealant 400. A problem that may occur when the area of the plurality of penetration openings 150A in the metal layer 150' is larger than a predetermined area will be described below.

Figure 3:
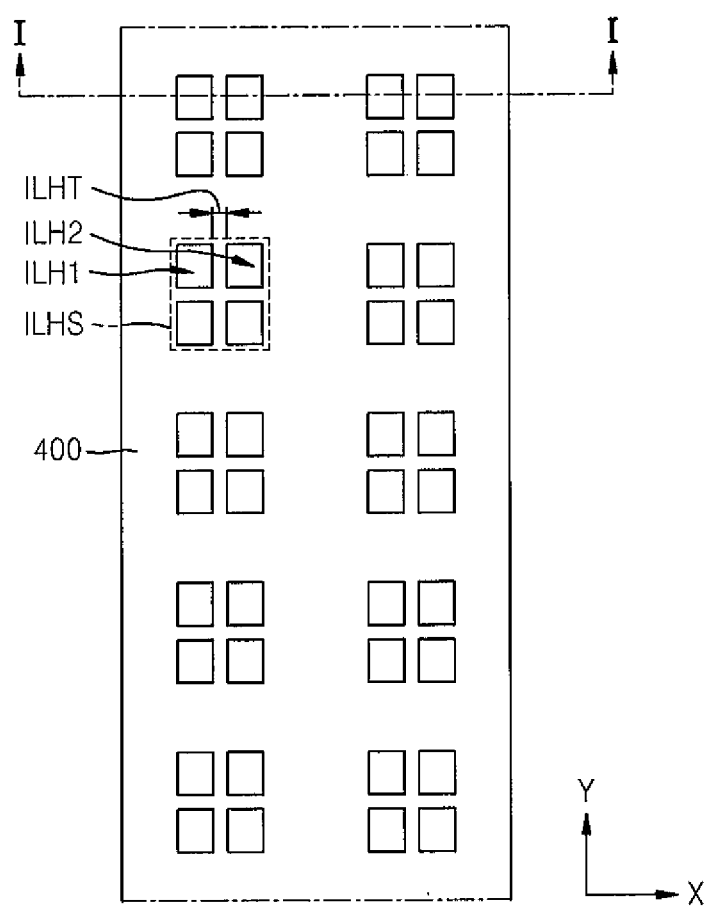
FIG. 3 is a plan view illustrating the plurality of penetration holes in the insulating layer of an organic light-emitting display apparatus, according to another embodiment of the present invention.

FIG. 3 is a plan view illustrating the plurality of penetration holes in the insulating layer IL of an organic light-emitting display apparatus, according to another embodiment of the present invention. FIG. 1 may be interpreted as a cross-sectional view according to the line I-I of FIG. 3.

In FIG. 3, the sealant 400 is illustrated, and the plurality of penetration holes in the insulating layer 1L that are formed under the sealant 400 are illustrated in solid lines for convenience.

As shown in FIG. 3, the insulating layer IL of the organic light-emitting display apparatus according to the present embodiment includes a plurality of penetration holes sets ILHS. Each of the plurality of penetration hole sets may include two or more penetration holes. An embodiment in which each of the plurality of penetration hole sets includes four penetration holes is illustrated in FIG. 3.

A distance ILHT between two or more penetration holes of each of the plurality of penetration hole sets ILHS in the insulating layer IL (hereinafter, referred to as "distance ILHT") may be 2.5 μm or more. When the distance ILHT is less than 2.5 μm, an area of the sealant 400 contacting the insulating layer IL may be reduced. Thus, the insulating layer IL between the adjacent penetration holes may collapse and form a single penetration hole. In this case, the distance ILHT is not a distance between the center of the plurality of penetration holes, but a distance between an inner surface of a penetration hole facing another penetration hole and an inner surface of another penetration hole facing a penetration hole, when a penetration hole and another penetration hole are adjacent to each other. That is, the distance ILHT may be regarded as a thickness of the insulating layer IL between the plurality of penetration holes.

Figure 4:
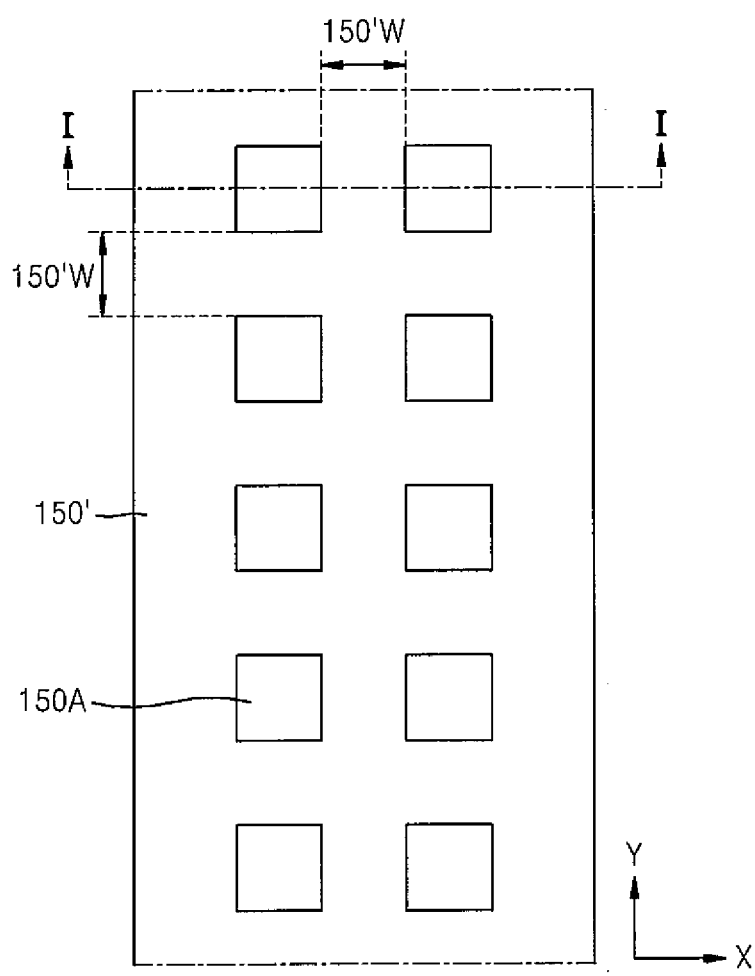
FIG. 4 is a plan view illustrating a plurality of penetration openings in a metal layer of an organic light-emitting display apparatus, according to another embodiment of the present invention.

FIG. 4 is a plan view illustrating a plurality of penetration openings 150A in the metal layer 150' of an organic light-emitting display apparatus, according to another embodiment of the present invention. FIG. 1 may be interpreted as a cross-sectional view according to the line I-I of FIG. 4. The metal layer 150' may include the plurality of penetration openings 150A that are arranged repeatedly as shown in FIG. 4. As described above, depending on whether or not the sealant 400 may be observed through the plurality of penetration openings 150A in the metal layer 150', the area of the sealant 400 contacting the lower substrate 110 may be identified.

The plurality of penetration hole sets ILHS in the insulating layer IL may be formed to correspond to the plurality of penetration openings 150A in the metal layer 150'. The plurality of penetration holes included in the plurality of penetration hole sets ILHS may be extended to the buffer layer 120 through the plurality of penetration openings 150A in the metal layer 150', in which the buffer layer 120 is positioned directly above the lower substrate 110. Accordingly, because the sealant 400 may directly contact the lower substrate 110, an adhesion strength of the sealant 400 may be improved.

As described above, each inner surface 150a' of the plurality of penetration openings 150A in the metal layer 150' may be covered by using the insulating layer 1L so as to not contact the sealant 400. To do so, an area of each of the plurality of penetration hole sets ILHS in the insulating layer IL may be narrower than an area of each of the plurality of penetration openings 150A, as shown in FIGS. 3 and 4.

Figure 5:
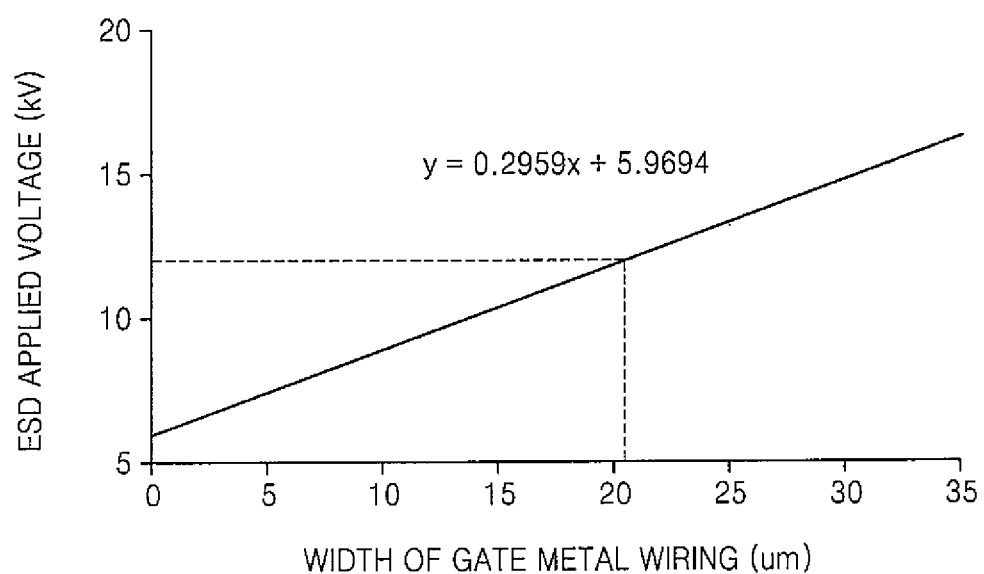
FIG. 5 is a graph illustrating electrostatic discharge (ESD) durability according to a distance between the plurality of penetration openings in the metal layer of the organic light-emitting display apparatus of FIG. 4.

FIG. 5 is a graph illustrating electrostatic discharge (ESD) durability according to a distance 150'W between the plurality of penetration openings 150A in the metal layer 150' (hereinafter, referred to as "distance 150'W") of the organic light-emitting display apparatus of FIG. 4. As described above, the metal layer 150' may be formed on the same layer as that of the gate electrode 150 of the thin film transistor TFT in the display area DA. Thus, in the surface parallel to the lower substrate 110 (the XY surface), the distance 150'W may be regarded as a width of a gate metal wiring.

The narrower the width of the gate metal wiring, the larger the resistance of the gate metal wiring. Therefore, even when static electricity of equal strength is applied to the metal layer 150', the narrower the width of the gate metal wiring, the greater the amount of heat that may be generated momentarily. As the amount of heat generated in the metal layer 150' increases, the adhesive properties of the sealant may decrease (e.g., the sealant 400 may peel off) or a degree of hardness of the sealant 400 may be reduced. Thus, the width of the gate metal wiring, that is, the distance 150'W, is to be appropriately adjusted.

In FIG. 5, the y-axis shows values of a strength of static electricity that may be applied to the metal layer 150', that is an ESD applied voltage; the x-axis shows a minimum width of the gate metal wiring that may cause the sealant 400 to peel off or a degree of hardness of the sealant 400 to be reduced, when the values of a strength of static electricity is applied to the metal layer 150'. A relationship between the minimum width of the gate metal wiring and the strength of the ESD applied voltage may be represented, for example, as $y=0.2959x+5.9694$, which is determined by carrying out an experiment multiple times. A unit of the width of the gate metal wiring is μm; a unit of the ESD applied voltage is kV.

As described above, static electricity may be generated during a process of manufacturing an organic light-emitting display apparatus or during a process of using the organic light-emitting display apparatus, and the static electricity may be transmitted to the metal layer 150'. In this case, when resistance of the metal layer 150' is large, heat may be generated in the metal layer 150' and thus weaken an adhesion strength of the (cured) sealant 400 or reduce hardness of the sealant 400.

In mobile devices that include an organic light-emitting display apparatus as a display unit, a maximum ESD applied voltage that the organic light-emitting display apparatus may be able to endure in a general usage environment is 12 kV. The maximum ESD applied voltage may be regarded as a maximum strength of static electricity that may be applied to an organic light-emitting display apparatus when manufacturing or using the organic light-emitting display apparatus in a general usage environment. In order to prevent the sealant 400 from being faulty in such an environment, in a surface parallel to the lower substrate 110 (XY surface), the distance 150'W may be about 20.5 μm or more, as shown using a dotted line in FIG. 5.

Because the distance 150'W may be about 20.5 μm or more, in the surface parallel to the lower substrate 110 (the XY surface), the area of each of the plurality of penetration openings 150A in the metal layer 150' has an upper limit. Accordingly, the area of the plurality of penetration holes in the insulating layer IL, which are positioned in the plurality of penetration openings 150A in the metal layer 150', may also have an upper limit. When the distance 150'W is about 20.5 μm, in the surface parallel to the lower substrate 110 (the XY surface), the area of the plurality of penetration holes in the insulating layer IL may be about 16.5% of or less than the area of the sealant 400. Thus, in the surface parallel to the lower substrate 110 (the XY surface), a ratio of the area of the plurality of penetration holes ILH1 and ILH2 in the insulating layer IL to the area of the sealant 400 may be between about 9.8% and about 16.5%.

Although the insulating layer IL is illustrated as including the buffer layer 120, gate insulating film 140 and interlayer insulating film 160 in FIG. 1, the insulating layer IL is not limited thereto. For example, the first insulating film 181 may be extended to the peripheral area PA and thus be included in the insulating layer IL as an element thereof, and may include a plurality of penetration holes in the peripheral area PA.

Figure 6:
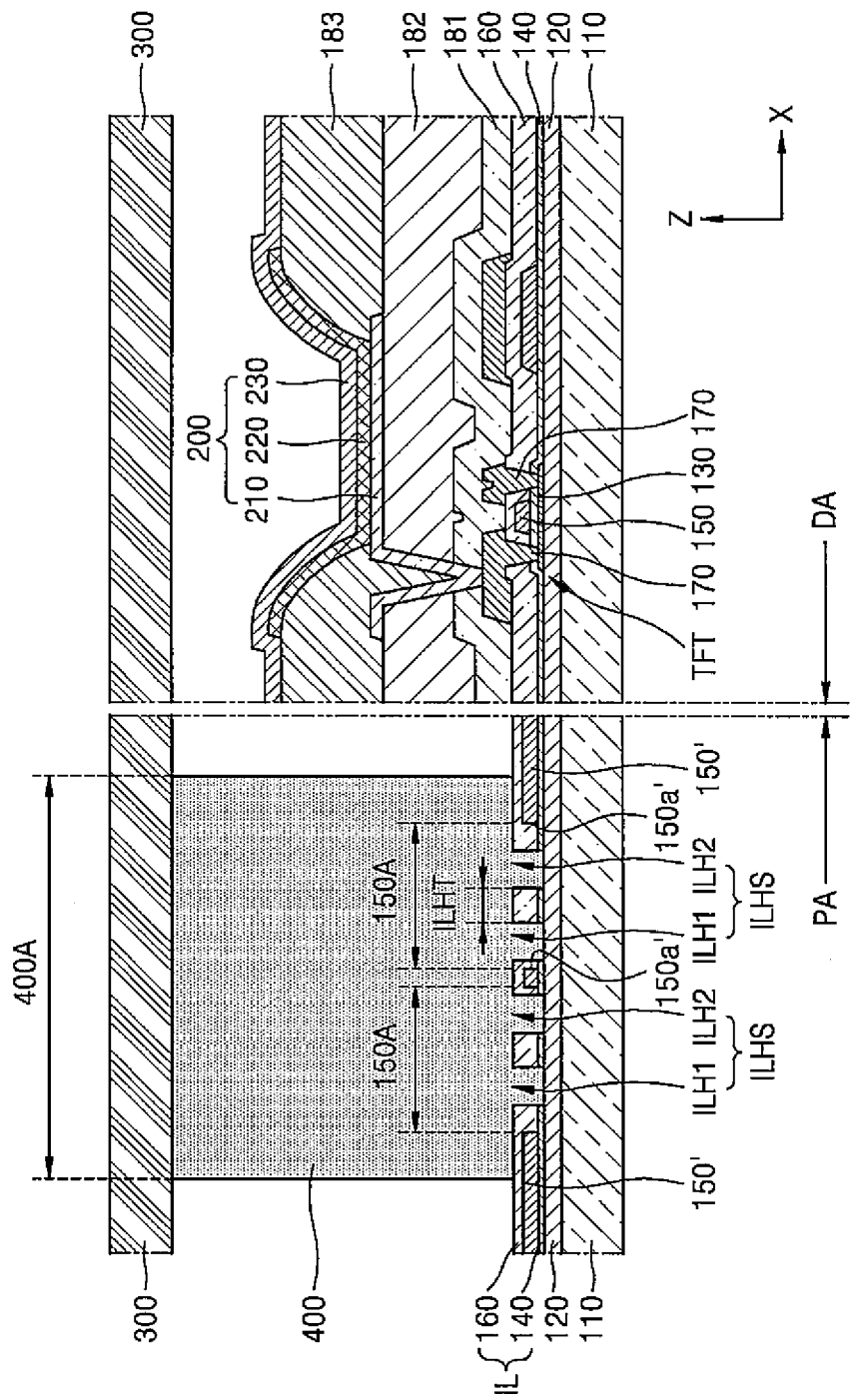
FIG. 6 is a cross-sectional view illustrating a portion of the organic light-emitting display apparatus, according to another embodiment of the present invention.

FIG. 6 is a cross-sectional view illustrating a portion of the organic light-emitting display apparatus according to another embodiment of the present invention. Referring to FIG. 6, the gate insulating layer IL includes only the gate insulating film 140 and interlayer insulating film 160, and the buffer layer 120 may not include a penetration hole. In this case, the buffer layer 120 may be regarded as an additional insulating layer that is positioned between the lower substrate 110 and the insulating layer IL.

Accordingly, the insulating layer IL may be regarded as an extended portion of at least one of the buffer layer 120, the gate insulating film 140, the interlayer insulating film 160, and the first insulating film 181 that is a protective film.

Figure 7:
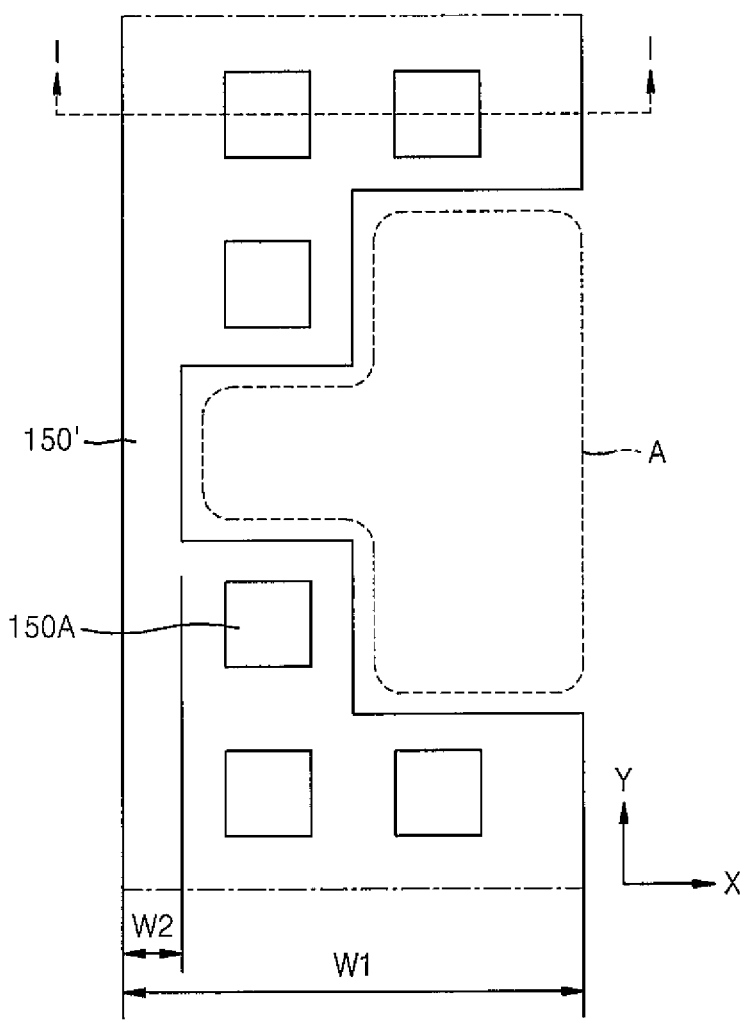
FIG. 7 is a plan view illustrating a plurality of penetration openings in a metal layer of the organic light-emitting display apparatus, according to still another embodiment of the present invention.

FIG. 7 is a plan view illustrating a plurality of penetration openings 150A in a metal layer of the organic light-emitting display apparatus according to still another embodiment of the present invention. In this case, FIG. 1 may be interpreted as a cross-sectional view according to the line I-I of FIG. 7.

Referring to FIGS. 1 and 7, the organic light-emitting display apparatus may include the metal layer 150' which is formed between the lower substrate 110 and the insulating layer IL in the peripheral area PA or formed in the insulating layer IL in the peripheral area PA, includes a plurality of penetration openings 150A, and includes a width-change part. FIG. 1 shows that the metal layer 150' is formed in the insulating layer IL, i.e., the metal layer 150' is interposed between the gate insulating film 120 and the interlayer insulating film 160. FIG. 7 shows that the metal layer 150' includes the width-change part, the width of which decreases from W1 to W2 and then increases from W2 to W1 in +y-axis direction. The metal layer 150' may be extended into the display area DA.

Because the metal layer 150' includes a metal, the metal layer 150' may shield an electromagnetic wave due to the characteristics of the metal. However, if the organic light-emitting display apparatus is used in a mobile apparatus such as a mobile phone, the metal layer 150' in the organic light-emitting display apparatus may shield the electromagnetic wave so that receiving sensibility of an antenna may decrease.

However, according to the organic light-emitting display apparatus of the present exemplary embodiment, the metal layer 150' includes the width-change part. Thus, it is possible to prevent the receiving sensibility of an antenna from decreasing by the width-change part which is formed to correspond to the position of the antenna. For example, a portion A shown in FIG. 7 may corresponds to the position of the antenna.

The width-change part of the metal layer 150' may be formed in other positions which does not correspond to the position of the antenna. For example, if a certain part of the edge portion of the organic light-emitting display apparatus is vulnerable to static electricity, the width-change part of the metal layer 150' may correspond to the certain part. Because the static electricity may be induced by the metal layer 150', it is possible to decrease the possibility of the static electricity inducement by the width-change part wherein the width of the metal layer 150' decreases.

Because the metal layer 150' has the width-change part, the insulating layer IL may include a first portion and a second portion. The first portion of the insulating layer IL contacts a layer beneath the metal layer 150' through the plurality of penetration openings 150A of the metal layer 150', and the second portion of the insulating layer IL contacts the layer beneath the metal layer 150' outside the metal layer 150' in a portion of the width-change part in which the width of the metal layer 150' decreases. In case of FIGS. 1 and 7, the first portion of the insulating layer IL contacts the lower substrate 110 through the plurality of penetration openings 150A of the metal layer 150', and the second portion of the insulating layer IL contacts the lower substrate 110 directly outside of the metal layer 150' in the portion A.

Figure 8:
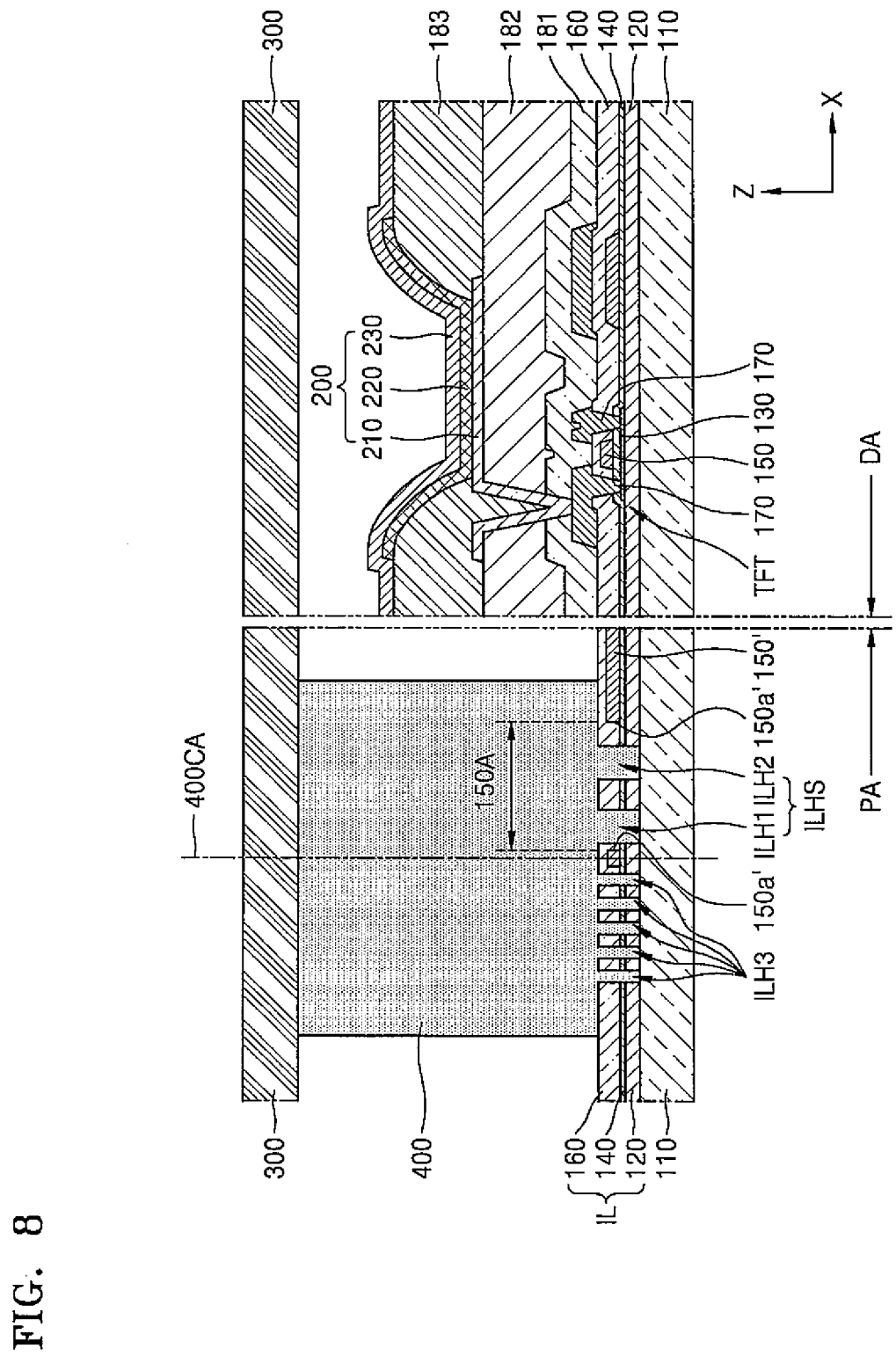
FIG. 8 is a cross-sectional view illustrating a portion of the organic light-emitting display apparatus, according to still another embodiment of the present invention.

FIG. 8 is a cross-sectional view illustrating a portion of the organic light-emitting display apparatus, according to still another embodiment of the present invention. According to the present exemplary embodiment of the invention, the metal layer 150' may be formed between the lower substrate 110 and the insulating layer IL in the peripheral area PA or formed in the insulating layer IL in the peripheral area PA, includes a plurality of penetration openings 150A. The metal layer 150' is formed in the peripheral area PA, however, the metal layer 150' is formed to be located biasedly to the display area DA in relation with the center of the peripheral area PA. For example, the metal layer 150' is located biasedly to the display area DA in relation with the central axis 400CA of the sealant 400.

It is possible to maintain or improve the adhesion strength between the sealant 400 and the lower substrate 110 because the contact area between the sealant 400 and the insulating layer IL increases due to the plurality of penetration holes ILH1 and ILH2. In order to increase the adhesion strength between the sealant 400 and the lower substrate 110, it is preferable to increase the number of the plurality of penetration holes ILH1 and ILH2. However, the position of the plurality of penetration holes ILH2 and ILH2 is limited due to the penetration openings 150A of the metal layer 150'. Thus, there is a limitation in increasing the number of the plurality of penetration holes ILH1 and ILH2 in a portion of the insulating layer IL corresponding to the metal layer 150'.

According to the present exemplary embodiment of the invention, the metal layer 150' is located biasedly to the display area DA in relation with the center of the peripheral area PA. Thus, the metal layer 150' may not exist in the most part of a outer region of the organic light-emitting display apparatus in relation with the central axis 400CA of the sealant 400. Therefore, the plurality of penetration holes ILH3 of the insulating layer IL may be formed regardless of the penetration openings 150A of the metal layer 150' in that region. As a result, by increasing the number of the penetration holes ILH3 per unit area in the most part of the outer region of the organic light-emitting display apparatus, it is possible to increase the contact area between the sealant 400 and the insulating layer IL. In this case, the number of the penetration holes ILH3 of the insulating layer IL per unit area in a region where the insulating layer IL does not correspond to the metal layer 150' may be higher than the number of the penetration holes ILH1 and ILH2 of the insulating layer per unit area in a region where the insulating layer IL corresponds to the metal layer 150'.

The metal layer 150' still exists in a region of the peripheral area PA in a direction to the display area DA. This is in order to protect the intermediate layer 220 of the plurality of OLEDs 200. The intermediate layer 220 is vulnerable to the impurities such as oxide or moisture. Thus, it is necessary to increase hardness of a portion of the sealant 400, the portion being close to the display area DA.

In order to increase hardness of the portion of the sealant 400, it is necessary to irradiate the portion of the sealant 400 with the UV light or the laser beam sufficiently. Because the metal layer 150' still exists in the region of the peripheral area PA in a direction to the display area DA, the UV light or the laser beam irradiated onto the sealant 400 and penetrating the sealant 400 is reflected by the metal layer 150' and reaches the sealant 400 again, thus the portion of the sealant 400 is sufficiently irradiated by the UV light or the laser beam.

Figure 9:
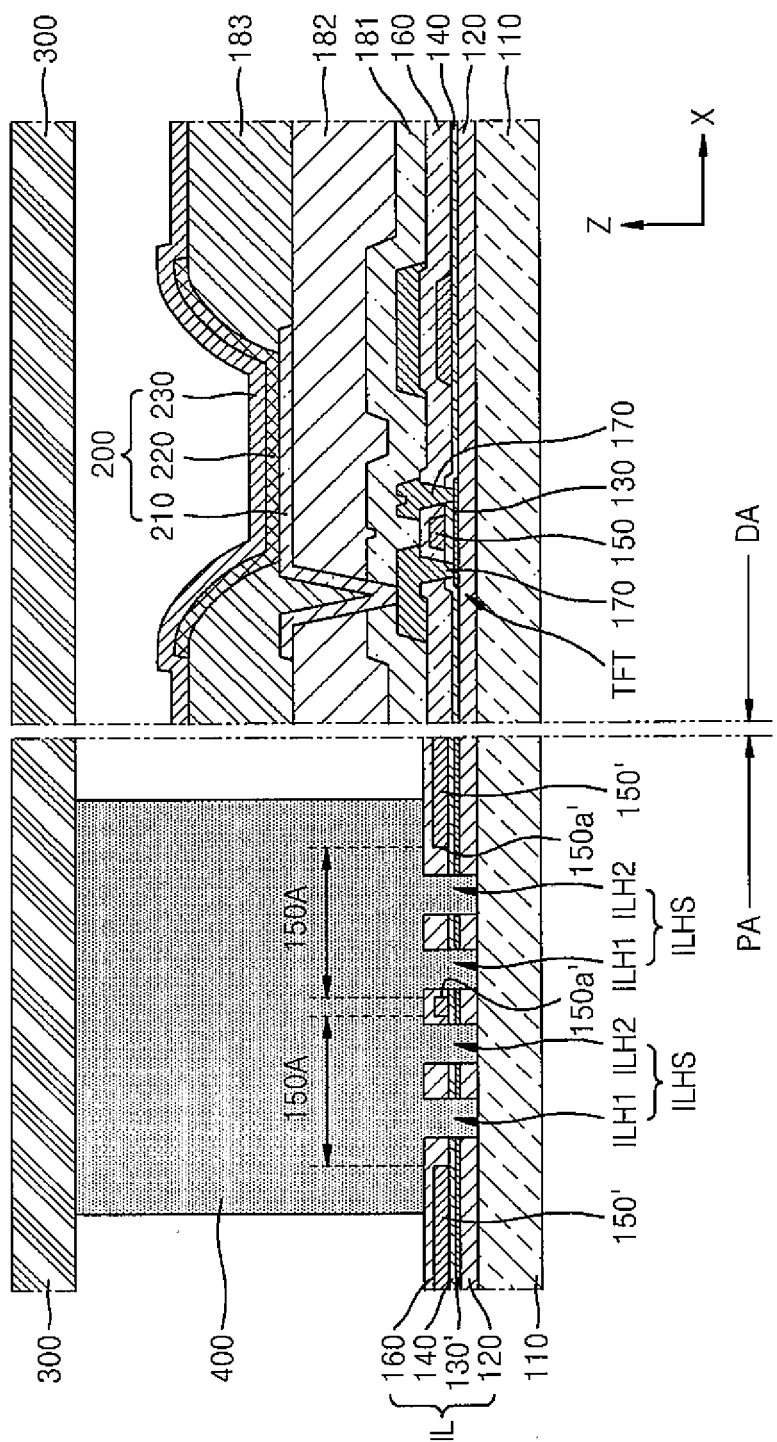
FIG. 9 is a cross-sectional view illustrating a portion of the organic light-emitting display apparatus, according to still another embodiment of the present invention.

FIG. 9 is a cross-sectional view illustrating a portion of the organic light-emitting display apparatus, according to still another embodiment of the present invention. According to the present exemplary embodiment of the invention, the organic light-emitting display apparatus comprises a dummy semiconductor layer 130'. The dummy semiconductor layer 130' may be formed on or under the insulating layer IL in the peripheral area PA, or formed in the insulating layer IL in the peripheral area PA. The dummy semiconductor layer 130' has a plurality of penetration apertures corresponding to the plurality of penetration holes ILH1 and ILH2. FIG. 9 shows that the dummy semiconductor layer 130' locates in the insulating layer IL, i.e., locates between the buffer layer 120 and the gate insulating layer 140. The sealant 400 fills the plurality of penetration holes ILH1 and ILH2 and the plurality of penetration apertures.

As described above, to use the sealant 400 and relatively securely bond the lower and upper substrates 110 and 300 to each other, a sufficient contact area is to be provided. According to the organic light-emitting display apparatus shown in FIG. 9, the depth of the plurality of penetration holes ILH1 and ILH2 becomes deeper due to the presence of the dummy semiconductor layer 130'. This increase in depth means the increase of contact area between the sealant 400 and the insulating layer IL (including the dummy semiconductor layer 130'), thus the adhesion strength between the sealant 400 and the lower substrate 110 becomes strong.

As described above, because the display area DA includes the thin film transistor TFT including the semiconductor layer 130, the dummy semiconductor layer 130' may include the same material as that of the semiconductor layer 130. Specifically, the dummy semiconductor layer 130' and the semiconductor layer 130 may be formed on the same layer. In FIG. 9, the dummy semiconductor layer 130' is illustrated as being formed on the buffer layer 120, like the semiconductor layer 130.

Although an organic light-emitting display apparatus is described above, the present invention is not limited thereto. For example, a method of manufacturing an organic light-emitting display apparatus may also be included in the scope of the present invention.

A method of manufacturing the organic light-emitting display apparatus according to an embodiment of the present invention will now be described. The method includes preparing the lower substrate 110 which includes the display area DA and the peripheral area PA that surrounds the display area DA; and forming the insulating layer IL over the display area DA and the peripheral area DA of the lower substrate 110, and includes forming the plurality of penetration holes ILH1 and ILH2 in the peripheral area PA.

The buffer layer 120, gate insulating layer 140 and interlayer insulating film 160 may be formed over the display area DA and the peripheral area PA of the lower substrate 110. Then, a penetration hole that exposes a portion of the source/drain electrodes 170 of the thin film transistor TFT in the display area DA may be formed to couple the pixel electrode 210 to the source/drain electrodes 170. At the same time, the plurality of penetration holes ILH1 and ILH2 penetrating through the buffer layer 120, gate insulating film 140 and interlayer insulating film 160 in the peripheral area PA may be formed. In this case, the insulating layer IL may be regarded as including the buffer layer 120, gate insulating film 140 and interlayer insulating film 160. The insulating film IL may include at least one of the buffer layer 120, gate insulating film 140, and interlayer insulating film 160 (in FIG. 6, the insulating layer IL may be regarded as including only the gate insulating film 140 and interlayer insulating film 160), and/or further include at least one of the first protective film 181 and second protective film 182.

Next, the OLED 200 and other elements are formed. Then, the upper substrate 300 which corresponds to the lower substrate 100 is prepared. The upper substrate 300 may be prepared before processing the lower substrate 110, or the upper substrate 300 may be prepared while processing the lower substrate 110. Here, processing the lower substrate 110 may mean forming the insulating layer IL on the lower substrate 110, etc. Then, the plurality of penetration holes in the insulating layer IL are filled (or substantially filled) with the sealant 400, and the lower and upper substrates 110 and 300 are bonded to each other by using the sealant 400.

When forming the thin film transistor TFT while forming the gate electrode 150, the metal layer 150', which is located in the peripheral area PA of the lower substrate 110 and includes the plurality of penetration openings 150A may be formed. In the forming of the insulating layer IL, the metal layer 150' may be formed to be positioned between the lower substrate 110 and the insulating layer IL. Furthermore, in the forming of the insulating layer IL, the insulating layer IL may be formed to include the plurality of penetration hole sets ILHS that correspond to the plurality of penetration openings 150A in the metal layer 150', in which each of the plurality of penetration hole sets ILHS includes two or more penetration holes.

In the forming of the insulating layer IL, the insulating layer IL may be formed so that a minimum distance between two or more penetration holes in each of the plurality of penetration hole sets ILHS in the insulating layer IL is about 2.5 µm or more. The minimum distance may provide the same characteristics as described earlier above.

The metal layer 150' may be formed so that a minimum distance between the plurality of penetration openings 150A is about 20.5 µm or more. The minimum distance may provide the same characteristics as described earlier above with respect to static electricity.

The insulating layer IL may be formed so that in the surface parallel to the lower substrate 110 (the XY surface), a total area of the plurality of penetration holes ILH1 and ILH2 in the insulating layer IL may be between about 9.8% and about 16.5% of the area of the sealant 400. The lower limit and upper limit may provide the same characteristics as described earlier above.

In the forming of the insulating layer IL, the buffer layer 120, gate insulating film 140, and interlayer insulating film 160 may be formed over the display area DA and the peripheral area PA of the lower substrate 110; and the plurality of penetration holes penetrating through the buffer layer 120, gate insulating film 140, and interlayer insulating film 160 may be formed.

The metal layer 150' may be formed to have a width-change part in which the width of the metal layer 150' changes, as shown in FIG. 7.

The metal layer 150' may be formed biasedly to the display area DA, as shown in FIG. 8.

A dummy semiconductor layer 130' may be formed on or under the insulating layer IL in the peripheral area PA, or formed in the insulating layer IL in the peripheral area PA, as shown in FIG. 9. The dummy semiconductor layer 130' may have a plurality of penetration apertures corresponding to the plurality of penetration holes ILH1 and ILH2. The dummy semiconductor layer 130' may be formed to include the same material as that of the semiconductor layer 130. Specifically, the dummy semiconductor layer 130' and the semiconductor layer 130 may be formed on the same layer.

As described above, according to the one or more of the above embodiments of the present invention, an organic light-emitting display apparatus in which shock damage may be reduced and a method of manufacturing the same are provided.

It should be understood that the example embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims, and their equivalents.

What is claimed is:

1. An organic light-emitting display apparatus (comprising:
    a lower substrate comprising a display area and a peripheral area around the display area;
    an insulating layer on the display area and the peripheral area of the lower substrate, wherein a plurality of penetration holes are formed in the insulating layer in the peripheral area;
    a conductive layer between the lower substrate and the first-insulating layer, wherein a plurality of penetration openings are formed in the conductive layer;
    an upper substrate on the lower substrate; and
    a sealant in the plurality of penetration holes bonding the lower substrate to the upper substrate, wherein the insulating layer comprises a plurality of penetration hole sets that correspond to the plurality of penetration openings in the conductive layer, and each penetration hole set of the plurality of penetration hole sets comprises two or more penetration holes of the plurality of penetration holes within a respective penetration opening of the plurality of penetration openings.

2. The organic light-emitting display apparatus of claim 1, further comprising an additional insulating layer between the lower substrate and the insulating layer.

3. The organic light-emitting display apparatus of claim 1, wherein an area of a penetration hole set from among the plurality of penetration hole sets in the insulating layer is narrower than an area of a corresponding penetration opening from among the plurality of penetration openings in the conductive layer.

4. The organic light-emitting display apparatus of claim 1, wherein an inner surface of each penetration opening of the plurality of penetration openings in the conductive layer is covered by the insulating layer, and does not contact the sealant.

5. The organic light-emitting display apparatus of claim 1, wherein a distance between the penetration holes in each of the plurality of penetration hole sets in the first insulating layer is 2.5 µm or more.

6. The organic light-emitting display apparatus of claim 1, wherein a distance between penetration openings of the plurality of penetration openings in the conductive layer is 20.5 µm or more.

7. The organic light-emitting display apparatus of claim 1, wherein the display area comprises a thin film transistor comprising a gate electrode, and wherein the conductive layer comprises a same material as that of the gate electrode in the thin film transistor.

8. The organic light-emitting display apparatus of claim 7, wherein the conductive layer and the gate electrode are disposed on a same layer.

9. The organic light-emitting display apparatus of claim 1, wherein in a surface parallel to the lower substrate, a total area of the plurality of penetration holes in the first insulating layer is in a range of 9.8% and 16.5% of an area of the sealant.

10. The organic light-emitting display apparatus of claim 1, wherein the display area comprises a buffer layer, a gate insulating film, an interlayer insulating film, and a protective film, and wherein the insulating layer is an extended portion of at least one of the interlayer insulating film and the protective film.

11. The organic light-emitting display apparatus of claim 1, wherein the conductive layer is located in the peripheral area and has a width-change part in which a width of the conductive layer changes.

12. The organic light-emitting display apparatus of claim 11, wherein the first insulating layer has a first portion and a second portion, the first portion contacting a layer beneath the conductive layer through the plurality of penetration openings of the conductive layer, the second portion contacting the layer beneath the conductive layer outside the conductive layer in a region of the width-change part of the conductive layer.

13. The organic light-emitting display apparatus of claim 1, wherein the conductive layer is located in the peripheral area and a center of the conductive layer is relatively closer to the display area than a center of the sealant.

14. The organic light-emitting display apparatus of claim 13, further comprising an additional plurality of penetration holes formed in the insulating layer where the insulating layer does not correspond to the conductive layer, wherein a number of penetration holes the additional plurality of penetration holes of the insulating layer per unit area is higher than a number of penetration holes of the plurality of penetration holes of the insulating layer per unit area.

15. The organic light-emitting display apparatus of claim 1, further comprising a dummy semiconductor layer under the insulating layer or in the insulating layer, wherein the dummy semiconductor layer locates in the peripheral area, and has a plurality of penetration apertures corresponding to the plurality of penetration holes of the insulating layer, and wherein the sealant fills the plurality of penetration apertures and the plurality of penetration holes.

16. The organic light-emitting display apparatus of claim 15, wherein the display area comprises a thin film transistor comprising a semiconductor layer, and wherein the dummy semiconductor layer comprises a same material as that of the semiconductor layer in the thin film transistor.

17. The organic light-emitting display apparatus of claim 16, wherein the dummy semiconductor layer and the semiconductor layer are disposed on a same layer.

* * * * *